(12) United States Patent
Kim et al.

(10) Patent No.: US 9,472,539 B2
(45) Date of Patent: Oct. 18, 2016

(54) SEMICONDUCTOR CHIP AND A SEMICONDUCTOR PACKAGE HAVING A PACKAGE ON PACKAGE (POP) STRUCTURE INCLUDING THE SEMICONDUCTOR CHIP

(71) Applicant: SAMSUNG ELECTRONICS CO., LTD., Suwon-Si, Gyeonggi-Do (KR)

(72) Inventors: Yong-Hoon Kim, Suwon-si (KR); Hyo-Soon Kang, Seoul (KR); Hee-Seok Lee, Yongin-si (KR); Jang-Ho Cho, Yongin-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/992,174

(22) Filed: Jan. 11, 2016

(65) Prior Publication Data
US 2016/0126229 A1    May 5, 2016

Related U.S. Application Data

(62) Division of application No. 14/132,516, filed on Dec. 18, 2013, now abandoned.

(30) Foreign Application Priority Data

Apr. 29, 2013    (KR) ........................ 10-2013-0047698

(51) Int. Cl.
| H01L 23/48 | (2006.01) |
| H01L 25/18 | (2006.01) |
| H01L 23/50 | (2006.01) |
| H01L 23/498 | (2006.01) |
| H01L 25/065 | (2006.01) |
| H01L 25/10 | (2006.01) |

(Continued)

(52) U.S. Cl.
CPC .............. *H01L 25/18* (2013.01); *G11C 5/025* (2013.01); *H01L 23/3107* (2013.01); *H01L 23/49816* (2013.01); *H01L 23/50* (2013.01);

*H01L 24/17* (2013.01); *H01L 24/49* (2013.01); *H01L 25/0657* (2013.01); *H01L 25/105* (2013.01); *H01L 21/563* (2013.01); *H01L 23/3128* (2013.01); *H01L 23/49827* (2013.01); *H01L 2224/16225* (2013.01); *H01L 2224/32145* (2013.01); *H01L 2224/32225* (2013.01); *H01L 2224/48091* (2013.01); *H01L 2224/48225* (2013.01); *H01L 2224/48227* (2013.01); *H01L 2224/73204* (2013.01); *H01L 2224/73265* (2013.01); *H01L 2225/0651* (2013.01); *H01L 2225/06517* (2013.01); *H01L 2225/06572* (2013.01); *H01L 2924/1431* (2013.01); *H01L 2924/1434* (2013.01); *H01L 2924/15311* (2013.01); *H01L 2924/181* (2013.01)

(58) Field of Classification Search
CPC ................... H01L 23/49816; H01L 23/3128; H01L 23/49827; H01L 23/481; H01L 23/50; H01L 2224/16225; H01L 2224/3225; H01L 2224/73265; H01L 2224/48091; H01L 2224/48227; H01L 2224/73204; H01L 2224/32145; H01L 25/18; H01L 25/105; H01L 25/0657; H01L 24/49; H01L 24/85
See application file for complete search history.

(56) References Cited

U.S. PATENT DOCUMENTS 6,492,727 B2    12/2002    Nishizawa et al.
7,554,181 B2    6/2009    Satou et al.
(Continued)

*Primary Examiner* — Hoa B Trinh
(74) *Attorney, Agent, or Firm* — F. Chau & Associates, LLC

(57) ABSTRACT

A semiconductor chip including a substrate, a first data pad arranged on the substrate, and a first control/address pad arranged on the substrate, wherein the first data pad is arranged in an edge region of the substrate, and the first control/address pad is arranged in a center region of the substrate.

24 Claims, 9 Drawing Sheets

(51) Int. Cl.
    *G11C 5/02*     (2006.01)
    *H01L 23/00*     (2006.01)
    *H01L 21/56*     (2006.01)
    *H01L 23/31*     (2006.01)

(56) References Cited

U.S. PATENT DOCUMENTS

| | | |
|---|---|---|
| 7,898,091 B2 | 3/2011 | Sprouse et al. |
| 7,994,623 B2 | 8/2011 | Nonomura et al. |
| 8,044,395 B2 * | 10/2011 | Lee .................. G11C 29/1201 257/208 |
| 2005/0077600 A1 | 4/2005 | Kotani |
| 2011/0013353 A1 | 1/2011 | Kwon et al. |
| 2011/0193205 A1 | 8/2011 | Hsieh |
| 2012/0049361 A1 | 3/2012 | Park et al. |
| 2014/0001653 A1 | 1/2014 | Kwon et al. |
| 2014/0319701 A1 | 10/2014 | Kim et al. |

\* cited by examiner

SEMICONDUCTOR CHIP AND A SEMICONDUCTOR PACKAGE HAVING A PACKAGE ON PACKAGE (POP) STRUCTURE INCLUDING THE SEMICONDUCTOR CHIP

CROSS-REFERENCE TO RELATED APPLICATION

This application is a divisional application of co-pending U.S. application Ser. No. 14/132,516 filed Dec. 18, 2013, which claims priority under 35 U.S.C. §119 to Korean Patent Application No. 10-2013-0047698, filed on Apr. 29, 2013, in the Korean Intellectual Property Office, the disclosures of which are each hereby incorporated by reference herein in their entireties.

TECHNICAL FIELD

The inventive concept relates to a semiconductor device, and more particularly, to a semiconductor package having a Package On Package (POP) structure.

DISCUSSION OF THE RELATED ART

As semiconductor products decrease in size and increase data throughput, highly integrated semiconductor chips in single packages are used. For a mobile phone with a small size and a small thickness, a Package On Package (POP) structure in which an application processor (AP) and a memory are stacked upon one another may be used.

SUMMARY

An exemplary embodiment of the inventive concept provides a semiconductor package having a Package On Package (POP) structure in which control/address pads are arranged, separate from data pads, in a center region of a substrate, to reduce a thickness of the semiconductor package and reduce design complexity in a wiring path.

According to an exemplary embodiment of the inventive concept, there is provided a semiconductor chip including: a substrate; a first data pad arranged on the substrate; and a first control/address pad arranged on the substrate, wherein the first data pad is arranged in an edge region of the substrate, and the first control/address pad is arranged in a center region of the substrate.

According to an exemplary embodiment of the inventive concept, the semiconductor chip may be a logic chip. The semiconductor chip may be an application processor for a mobile phone.

According to an exemplary embodiment of the inventive concept, the semiconductor chip may further include a second data pad and a second control/address pad, the first and second data pads may be arranged in adjacent edge regions of the substrate, the first and second control/address pads may be arranged opposite to the first and second data pads, respectively.

According to an exemplary embodiment of the inventive concept, the semiconductor chip may further include a second data pad and second control/address pad, and the first and second data pads may be arranged side by side in the same edge region of the substrate.

According to an exemplary embodiment of the inventive concept, the semiconductor chip may further include a second data pad and a second control/address pad, and the first and second data pads may be arranged in opposite edge regions of the substrate.

According to an exemplary embodiment of the inventive concept, the first data pad and the first control/address pad may form a channel.

According to an exemplary embodiment of the inventive concept, there is provided a semiconductor package having a POP structure, including: a first package including a first substrate and a first semiconductor chip mounted on the first substrate; a second package disposed on the first package and including a second substrate and a second semiconductor chip mounted on the second substrate; a first sealant for sealing the first semiconductor chip to the first substrate; a second sealant for sealing the second semiconductor chip to the second substrate; and at least one substrate interconnection member for connecting the first substrate and the second substrate, wherein a first data pad is arranged in an edge region of the first semiconductor chip, and a first control/address pad is arranged in a center region of the first semiconductor chip.

According to an exemplary embodiment of the inventive concept, the first semiconductor chip may include a logic chip and the second semiconductor chip may include a memory chip.

According to an exemplary embodiment of the inventive concept, the semiconductor package may further include a second data pad and a second control/address pad, the first and second data pads may be arranged in adjacent edge regions of the first semiconductor chip, and the first and second control/address pads may be arranged in the center region of first semiconductor chip unit, opposite to the first and second data pads, respectively.

According to an exemplary embodiment of the inventive concept, the substrate interconnection members may be arranged in three rows in respective first and second opposite edge regions of the first substrate, and the substrate interconnection members may be arranged in two rows in respective third and fourth opposite edge regions of the first substrate, the first and second data pads being arranged along the first opposite edge region.

According to an exemplary embodiment of the inventive concept, the semiconductor package may further include a second data pad and a second control/address pad, and the first and second pads may be arranged side by side in the same edge region of the first semiconductor chip.

According to an exemplary embodiment of the inventive concept, the substrate interconnection members may be arranged in three rows in an edge region of the first substrate in which the first and second data pads may be arranged, and the substrate interconnection members may be arranged in two rows in three other respective edge regions of the first substrate.

According to an exemplary embodiment of the inventive concept, the semiconductor package may further include a second data pad and a second control/address pad, and the first and second data pads may be arranged in opposite edge regions of the first semiconductor chip.

According to an exemplary embodiment of the inventive concept, the substrate interconnection members may be arranged in three rows in respective edge regions of the first substrate in which the first and second data pads may be arranged, and the substrate interconnection members may not be arranged in the other edge regions of the first substrate.

According to an exemplary embodiment of the inventive concept, the first data pad and first control/address pad may form a channel.

According to an exemplary embodiment of the inventive concept, there is provided a semiconductor package including a first semiconductor chip; a data pad disposed on a first surface of the first semiconductor chip; and a control/address pad disposed on the first surface of the first semiconductor chip, wherein the data pad is disposed in an edge portion of the first semiconductor chip and the control/address pad is disposed in a center portion of the first semiconductor chip.

According to an exemplary embodiment of the inventive concept, the semiconductor package may further include a second semiconductor chip facing a second surface of the first semiconductor chip.

According to an exemplary embodiment of the inventive concept, the second semiconductor chip may include a memory chip.

According to an exemplary embodiment of the inventive concept, the memory chip may include a double-data rate synchronous dynamic random access memory.

According to an exemplary embodiment of the inventive concept, the data pad and the control/address pad may form a channel.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Figure 1:
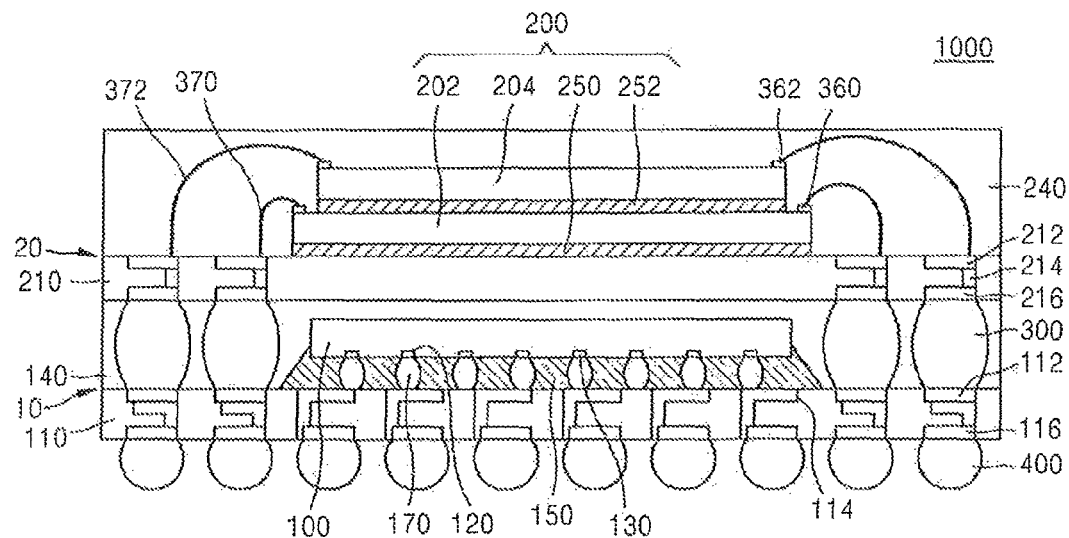
FIG. 1 is a cross-sectional view of a semiconductor package having a Package On Package (POP) structure, according to an exemplary embodiment of the inventive concept.

Hereinafter, exemplary embodiments of the inventive concept will be described in detail with reference to the accompanying drawings. The inventive concept may, however, be embodied in many different forms and should not be construed as being limited to the embodiments set forth herein.

As used herein, the singular forms "a," "an" and "the" are intended to include the plural forms as well, unless the context clearly indicates otherwise.

It will be understood that when an element is referred to as being connected to another element, the element can be connected to the another element directly or via intervening elements. In the drawings, structures and sizes of elements may be exaggerated for clarity. Like reference numerals in the drawings may denote like elements.

FIG. 1 is a cross-sectional view of a semiconductor package 1000 having a Package On Package (POP) structure, according to an exemplary embodiment of the inventive concept.

Referring to FIG. 1, the semiconductor package 1000 may include a first package 10, a second package 20, and a substrate interconnection member 300. As illustrated in FIG. 1, the semiconductor package 1000 may have a POP structure in which the second package 20 is stacked on the first package 10.

The first package 10 may include a first substrate 110, a first semiconductor chip unit 100 and a sealant 140

The first substrate 110 may support the first semiconductor chip unit 100 and may have pads arranged on upper and lower surfaces thereof. For example, an upper pad 112 and an intermediate pad 114 may be arranged on the upper surface of the first substrate 110, while a lower pad 116 may be arranged on the lower surface of the first substrate 110. Non-limiting exemplary materials for the first substrate 110 include silicon, glass, ceramic, and plastic.

The first substrate 110 may be formed from an active wafer or an interposer substrate. The active wafer may be a wafer, such as a silicon wafer, in which a semiconductor chip may be integrated. The first substrate 110 may include a multi-layer structure including wiring patterns (not shown). The upper pad 112 and the intermediate pad 114 may be electrically connected to the lower pad 116 via the wiring pattern.

An external connection member 400 for mounting the first semiconductor package 10 onto an external device may be disposed on the lower pad 116 arranged on the lower surface of the first substrate 110.

Data pads 120 and control/address pads 130 may be arranged on a lower surface of the first semiconductor chip unit 100. The first semiconductor chip unit 100 may be mounted on the first substrate 110 by flip-chip bonding via a connection member 170 attached to the data pads 120 and the control/address pads 130. In other words, the connection member 170 may physically and electrically connect the data pads 120 and the control/address pads 130 to the intermediate pad 114.

An underfill 150 may be filled between the first semiconductor chip unit 100 and the first substrate 110. The underfill 150 may be formed of an underfill resin, for example, epoxy resin. The underfill 150 may include a silica filler or flux. In an exemplary embodiment of the inventive concept, an adhesive member, instead of the underfill 150, may be disposed between the first semiconductor chip unit 100 and the first substrate 110. Non-limiting examples of the adhesive member include a non-conductive film (NCF), an anisotropic conductive film (ACF), an ultraviolet (UV) film, an instant adhesive, a thermocurable adhesive, a laser curable adhesive, an ultrasonic curable adhesive, and a non-conductive paste (NCP).

The second package 20 may include a second substrate 210, a second semiconductor chip unit 200, and a sealant 240.

The second substrate 210 may be formed of silicon, glass, ceramic, or plastic, similar to the first substrate 110. However, materials for the second substrate 210 are not limited thereto. Pads may be arranged on upper and lower surfaces of the second substrate 210. In particular, a bonding pad 212 and an intermediate pad 214 may be arranged on the upper surface of the second substrate 210, while a connection pad 216 may be arranged on the lower surface thereof. The second substrate 210 may have a multi-layer structure including wiring patterns (not shown), via which the bonding pad 212 and the intermediate pad 214 on the upper surface of the second substrate 210 may be electrically connected to the connection pad 216 on the lower surface of the second substrate 210.

The second semiconductor chip unit 200 may include a $(2-1)^{th}$ semiconductor chip 202, a $(2-2)^{th}$ semiconductor chip 204, and first and second adhesives 250 and 252. An upper chip pad (hereinafter, a $(2-1)^{th}$ chip pad) 360 for a first channel may be arranged on the upper surface of the $(2-1)^{th}$ semiconductor chip 202, while an upper chip pad (hereinafter, a $(2-2)^{th}$ chip pad) 362 for a second channel may be arranged on the upper surface of the $(2-2)^{th}$ semiconductor chip 204. The $(2-1)^{th}$ chip pad 360 and the $(2-2)^{th}$ chip pad 362 for the different first and second channels may be arranged separated from one another. The $(2-1)^{th}$ chip pad 360 may be arranged at opposite edge regions of the $(2-1)^{th}$ semiconductor chip 202, while the $(2-2)^{th}$ chip pad 362 may be arranged at opposite edge regions of the $(2-2)^{th}$ semiconductor chip 204.

The $(2-1)^{th}$ chip pad 360 and the $(2-2)^{th}$ chip pad 362 may be electrically connected to the bonding pad 212 by wires 370 and 372 via which the $(2-1)^{th}$ semiconductor chip 202 and the $(2-2)^{th}$ semiconductor chip 204 are electrically and physically connected to the second substrate 210. In other words, the $(2-1)^{th}$ semiconductor chip 202 and the $(2-2)^{th}$ semiconductor chip 204 may be mounted on the second substrate 210 by wire bonding.

The $(2-1)^{th}$ chip pad 360 and the wire 370 are for the first channel, while the $(2-2)^{th}$ chip pad 362 and the wire 372 are for the second channel. An arrangement of the first and second channels and the chip pads 360 and 362 will be described below in greater detail with reference to FIG. 3.

The first adhesive 250 may fix the $(2-1)^{th}$ semiconductor chip 202 to the second substrate 210. The second adhesive 252 may fix the $(2-2)^{th}$ semiconductor chip 204 to the $(2-1)^{th}$ semiconductor chip 202. The first and second adhesives 250 and 252 may each be, for example, an NCF, a UV film, an instant adhesive, a thermocurable adhesive, a laser curable adhesive, an ultrasonic curable adhesive, or an NCP.

The substrate interconnection member 300 may physically and electrically connect the upper pad 112 of the first substrate 110 and the connection pad 216 of the second substrate 210, and may fix the first package 10 and the second package 20 to be structurally stable. The substrate interconnection member 300 may be formed, for example, as a solder ball. However, the material for the substrate interconnection member 300 is not limited to solder.

For example, the substrate interconnection member 300 may include solder, silver (Ag), copper (Cu), or aluminum (Al). Although a structure of the substrate interconnection member 300 is illustrated as an oval column in FIG. 1, it is not limited thereto. For example, the substrate interconnection member 300 may have a structure like a circular column, a polyprism, or a polyhedron. The substrate interconnection member 300 may have a structure in which at least two solder balls are stacked upon one another.

In the semiconductor package 1000 of FIG. 1, the first semiconductor chip unit 100 may include one semiconductor chip, while the second semiconductor chip unit 200 may include two semiconductor chips, e.g., the $(2-1)^{th}$ semiconductor chip 202 and the $(2-2)^{th}$ semiconductor chip 204. However, an exemplary embodiment of the inventive concept is not limited thereto. For example, the first semiconductor chip unit 100 may include at least two semiconductor chips, while the second semiconductor chip unit 200 may include at least three semiconductor chips or one semiconductor chip.

In the semiconductor package 1000 of FIG. 1, the first semiconductor chip unit 100, the $(2-1)^{th}$ semiconductor chip 202, and the $(2-2)^{th}$ semiconductor chip 204 may be the same type or different types of chips. For example, the first semiconductor chip unit 100 may be a logic chip, and the $(2-1)^{th}$ semiconductor chip 202 and the $(2-2)^{th}$ semiconductor chip 204 may be memory chips.

The logic chip may be a microprocessor, for example, a central processing unit, (CPU), a controller, or an application specific integrated circuit (ASIC). The first semiconductor chip unit 100 may also be a System on Chip (SoC) AP used in a mobile system, for example, a mobile phone, an MP3 player, a navigation device, or a portable media player (PMP).

The memory chip may be a volatile memory, such as a dynamic random access memory (DRAM) or static random access memory (SRAM), or may be a non-volatile memory, such as a flash memory. The second semiconductor chip unit 200 may be a double-data rate synchronous dynamic random access memory (DDR SDRAM) (hereinafter, referred to as a "DDR chip").

According to an exemplary embodiment of the inventive concept, in the semiconductor package 1000 of FIG. 1, having a POP structure, the control/address pads 130 of the first semiconductor chip unit 100, e.g., an AP chip, may be in a center region of the AP chip, unlike conventional structures where a control/address pad is arranged along a edge region of the AP chip. The central arrangement of the control/address pads 130 simplify connection with the $(2-1)^{th}$ semiconductor chip 202 and the $(2-2)^{th}$ semiconductor chip 204, e.g., a DDR chip, in the second package 20, thereby improving timing, latency, and power consumption. The thickness of the semiconductor package 1000 can also be reduced.

Figure 2:
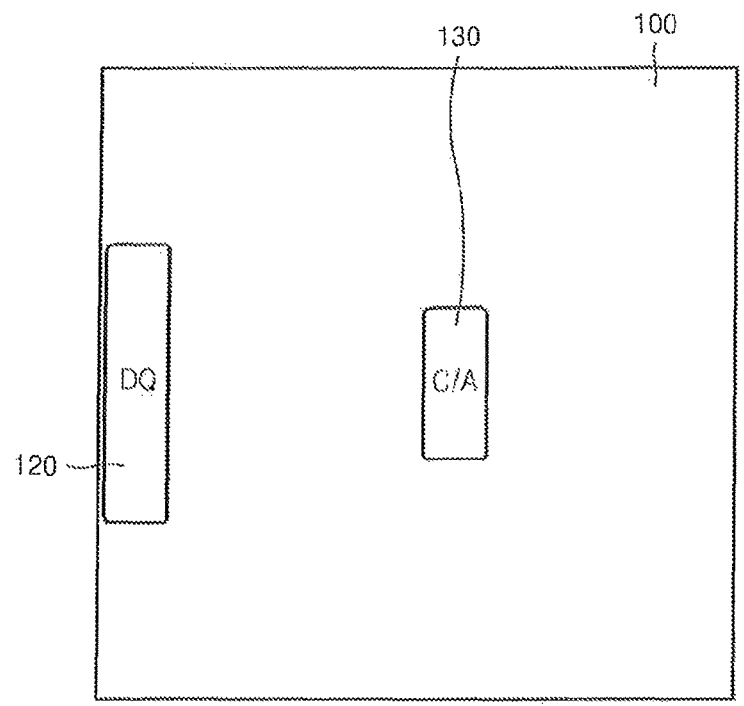
FIG. 2 is a plan view of a semiconductor package according to an exemplary embodiment of the inventive concept, illustrating an arrangement of pads in a first semiconductor chip unit mounted in a first substrate of a first package of FIG. 1.

FIG. 2 is a plan view of a semiconductor package according to an exemplary embodiment of the inventive concept, illustrating a data pad arrangement region and a control/address pad arrangement region in the first semiconductor chip unit 100 mounted in the first package 10 of the semiconductor package 1000 of FIG. 1.

Referring to FIG. 2, in the semiconductor package 1000, a data pad 120 of the first semiconductor chip unit 100, e.g., an AP chip, may be arranged in a left edge region of the first semiconductor chip unit 100, which may correspond to a data pad (not shown) of the DDR chip. A control/address pad 130 may be arranged inward from the data pad 120. The control/address pad 130 may be in a center region of the first semiconductor chip unit 100.

Although one data pad 120 and one control/address pad 130 for one channel are illustrated in FIG. 2, the data pad 120 and the control/address pad 130 may each be plural for at least two channels.

Figure 3:
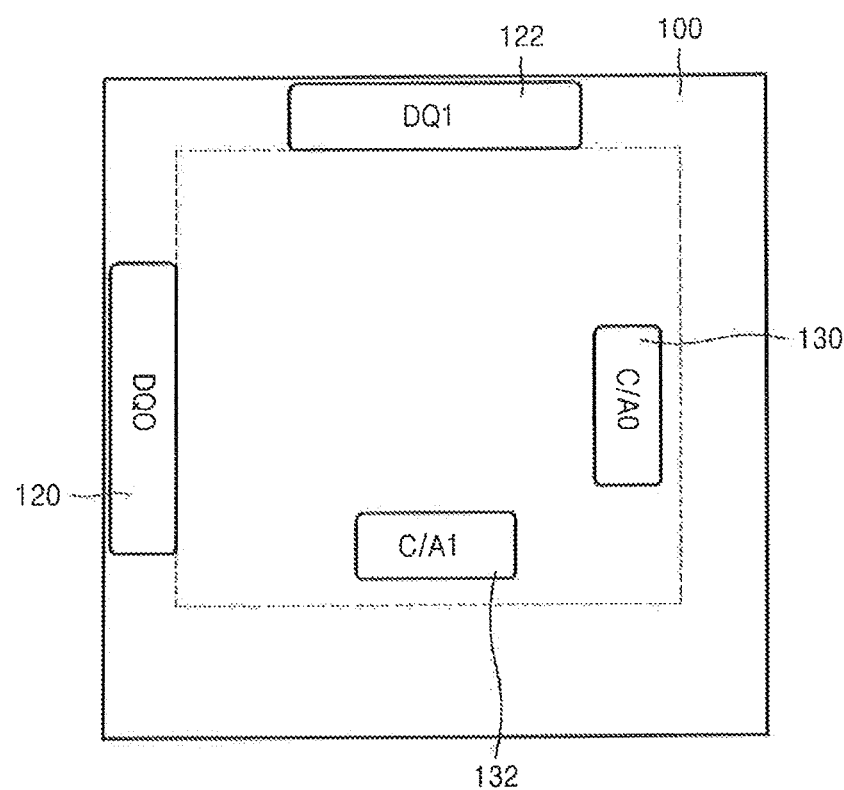
FIG. 3 is a plan view of a semiconductor package according to an exemplary embodiment of the inventive concept, illustrating an arrangement of pads when a first semiconductor chip unit mounted in a first substrate of a first package of FIG. 1 has two channels.

FIG. 3 is a plan view of a semiconductor package according to an exemplary embodiment of the inventive concept, illustrating an arrangement of data pads 120 and 122 and control/address pads 130 and 132 when the first semiconductor chip unit 100 mounted in the first package 10 of the semiconductor package 1000 of FIG. 1 has two channels.

Referring to FIG. 3, in the semiconductor package 1000, two data pads 120 and 122 may be arranged in adjacent edge regions of the first semiconductor chip unit 100, respectively, while control/address pads 130 and 132 may be arranged inwards from the data pads 120 and 122, e.g., toward a center region of the first semiconductor chip unit 100. Since the semiconductor package of FIG. 3 has two channels, two semiconductor chips may be mounted in the second package 20. In FIG. 3, DQ0 and C/A0 indicate a data pad and a control/address pad, respectively, for a first channel, while DQ1 and C/A1 indicate a data pad and a control/address pad, respectively, for a second channel. Accordingly, a pair of DQ0 and C/A0 may form a channel, while a pair of DQ1 and C/A1 may form another channel.

The control/address pads 130 and 132 may be arranged in a center region of the first semiconductor chip unit 100, which may simplify wire interconnection with the $(2-1)^{th}$ semiconductor chip 202 and the $(2-2)^{th}$ semiconductor chip 204, e.g., the DDR chips, for respective channels. This can improve timing, latency, and power consumption. The overall thickness of the semiconductor package 1000 can also be reduced. In other words, referring to FIG. 1, the data pads 120 and 122 and the control/address pads 130 and 132 may be electrically connected to the upper pad 112 of the first substrate 110 via the interconnection member 170 between the first semiconductor chip unit 100 and the first substrate 110, and to the upper bonding pad 212 of the second substrate 210 via the substrate interconnection member 300 connecting the first substrate 110 and the second substrate 210. The bonding pad 212, and the second semiconductor chip unit 200, for example, a DDR chip, may be electrically connected to the $(2-1)^{th}$ chip pad 360 and the $(2-2)^{th}$ chip pad 362 via the wires 370 and 372, respectively, for the respective channels. The connection pad 216 on a lower surface of the second substrate 210 may be physically and electrically connected to the substrate interconnection member 300, and the intermediate pad 214 of the second substrate 210 may be physically and electrically connected to the bonding pad 212 and the connection pad 216. Stacking the $(2-1)^{th}$ chip pad 360 and the $(2-2)^{th}$ chip pad 362 for respective channels in the second semiconductor chip unit 200 will be described below in greater detail with reference to FIGS. 7 and 8.

Figure 4:
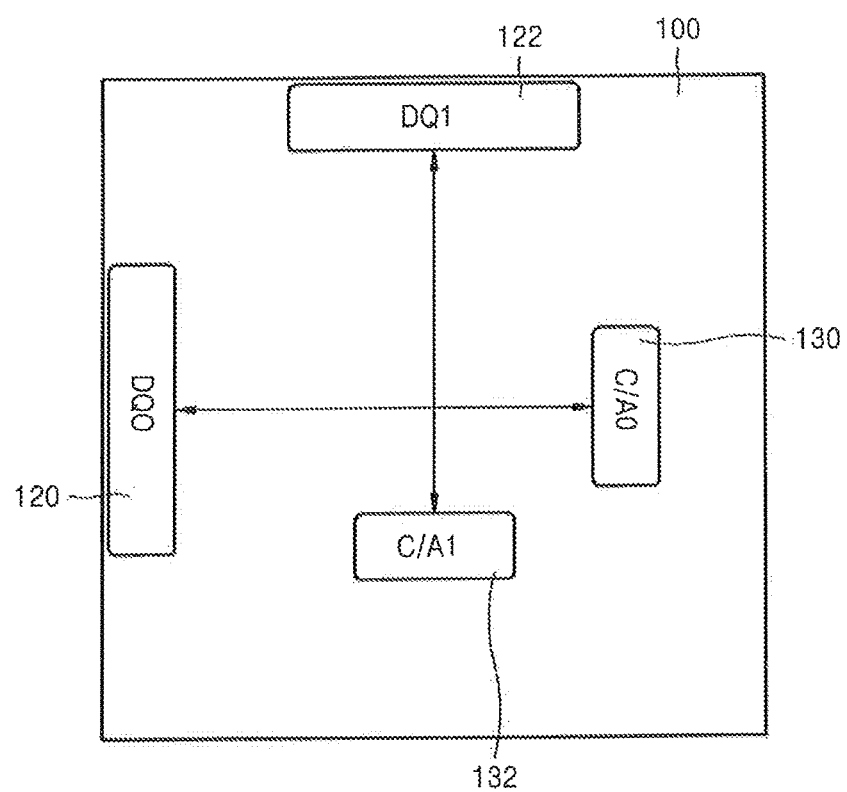
FIGS. 4 to 6 are plan views of semiconductor packages according to exemplary embodiments of the inventive concept, illustrating arrangements of pads when a semiconductor chip unit mount in a first substrate of a first package of FIG. 1 has two channels.
Figure 5:
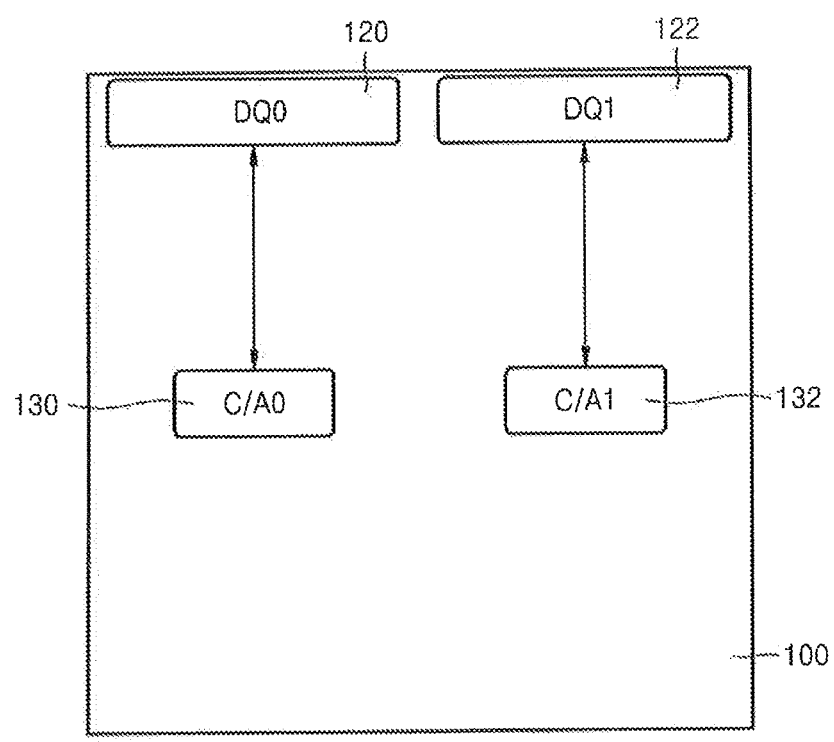
Figure 6:
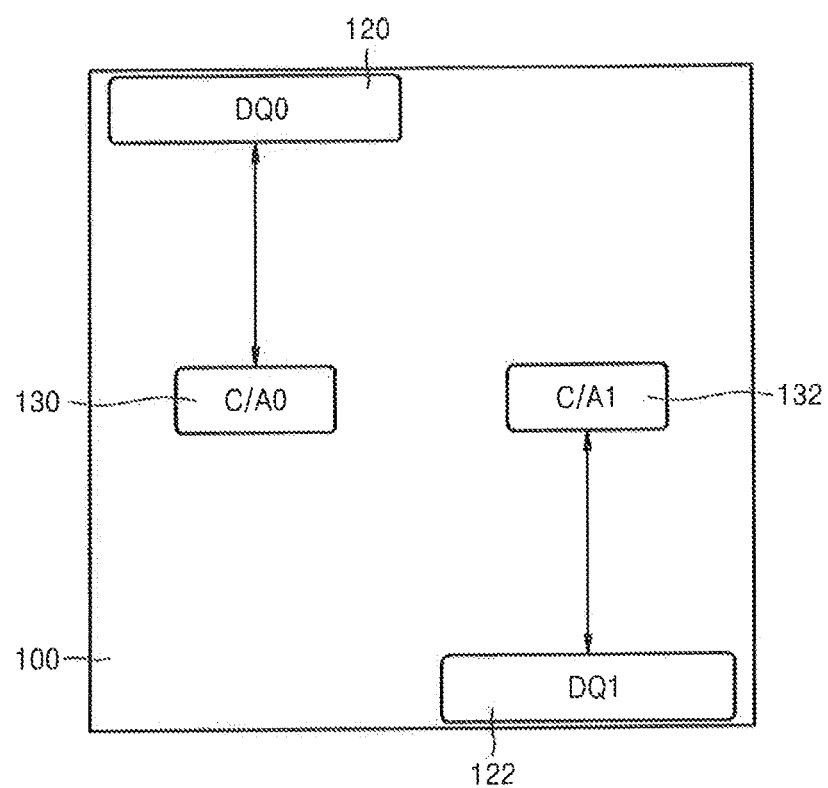

FIGS. 4 to 6 are plan views of semiconductor packages according to exemplary embodiments of the inventive concept, illustrating arrangements of data pads 120 and 122 and control/address pads 130 and 132 when the first semiconductor chip unit 100 mounted in the first package 10 of the semiconductor package 1000 of FIG. 1 has two channels.

FIG. 4 is a plan view of a semiconductor package according to an exemplary embodiment of the inventive concept, illustrating an arrangement of pads for each channel. Referring to FIG. 4, in the semiconductor package, two data pads 120 and 122 may be arranged in adjacent edge regions of the first semiconductor chip unit 100 to form an angle of 90°. Control/address pads 130 and 132 may be disposed opposite to the data pads 120 and 122, respectively, and may form pairs with the data pads 120 and 122, respectively, for respective channels. In FIG. 4, each bi-directional arrow indicates a pair of two pads. Wire interconnection with the second semiconductor chip unit 200 is about the same as that described above with reference to FIG. 3. When the first semiconductor chip unit 100 has two channels, the control/address pads 130 and 132 of the first semiconductor chip unit 100 may be arranged in a center region of the first semiconductor chip unit 100 to simplify wire interconnection with the second semiconductor chip unit 200, e.g., a DDR chip, for each channel. In other words, the data pads 120 and 122 may be arranged in adjacent edge regions of the first semiconductor chip unit 100, opposite to the $(2-1)^{th}$ semiconductor chip 202 and the $(2-2)^{th}$ semiconductor chip 204 as, for example, DDR chips, respectively, for the respective channels, thereby simplifying wire interconnections and improving data throughput. The control/address pads 130 and 132 may be arranged in a center region of the first semiconductor chip unit 100, thereby improving latency, timing, and power consumption.

Referring to FIG. 5, in a semiconductor package according to an exemplary embodiment of the inventive concept, two data pads 120 and 122 may be arranged side by side in the same edge region of the first semiconductor chip unit 100. Control/address pads 130 and 132 may be arranged opposite to the data pads 120 and 122, respectively, for respective channels. The control/address pads 130 and 132 may be arranged in a center region of the first semiconductor chip unit 100. A pair of data pad DQ0 and control/address pad C/A0, and a pair of data pad DQ1 and control/address pad C/A1 may form a pair of respective channels. In FIG. 5, each bi-directional arrow indicates a pair of two pads. Wire interconnection with the second semiconductor chip unit 200 mounted on the second substrate 210 is about the same as that described above with reference to FIG. 3. Unlike the previous embodiments of FIGS. 3 and 4, the data pads 120 and 122 may be arranged side by side in the same edge region of the first semiconductor chip unit 100, and the control/address pads 130 and 132 may be arranged side by side in the center region of the first semiconductor chip unit 100, opposite to the data pads 120 and 122, respectively. Accordingly, pads and substrate interconnection members 300 for connection with the second substrate 210 may be arranged in the same edge region of the first semiconductor chip unit 100 to correspond to the data pads 120 and 122 and control/address pads 130 and 132, which can simplify the structure of the semiconductor package and reduce the thicknesses of the first semiconductor chip unit 100 and first substrate 110.

Referring to FIG. 6, in a semiconductor package according to an exemplary embodiment of the inventive concept, the data pad 120 may be arranged in a left region of an edge region of the first semiconductor chip unit 100, and the other data pad 122 may be arranged in a right region of an edge region of the first semiconductor chip unit 100 opposite to the edge region in which the data pad 120 is arranged. A control/address pad 130 may be arranged in a center region of the first semiconductor chip unit 100, opposite to the data pad 120 to form a channel A control/address pad 132 may be arranged in the center region of the first semiconductor chip unit 100, opposite to the data pad 122 to form another channel. Accordingly, a pair of data pad DQ0 and control/address pad C/A0, and a pair of data pad DQ1 and control/address pad C/A1 may form a pair of respective channels. In FIG. 6, each bi-directional arrow indicates a pair of two pads. Wire interconnection with the second semiconductor chip unit 200 mounted on the second substrate 210 is about the same as that described above with reference to FIG. 3. In the embodiment of FIG. 6, the data pads 120 and 122 may be arranged on the opposite edge regions of the first semiconductor chip unit 100, respectively, so that the pads 120 and 122 and substrate interconnection members 300 for connection with the second substrate 210 may be evenly distributed on the two opposite edge regions of the first semiconductor chip unit 100, which may lead to a uniform chip thickness, compared to the embodiment of FIG. 5 where the data pads 120 and 122 may be arranged side by side in the same edge region of the first semiconductor chip unit 100, so that the pads 120 and 122 and substrate interconnection members 300 for connection with the second substrate 210 may be concentrated on the one edge region of the first semiconductor chip unit 100, which may lead to a non-uniform chip thickness.

Although the data pad 120 for a data channel may be arranged in the left region of an edge region of the first semiconductor chip unit 100, while the data pad 122 may be arranged in the right region of an opposite edge region, exemplary embodiments of the inventive concept are not limited thereto. For example, the data pad 120 for a data channel may be in a right region of an edge region of the first semiconductor chip unit 100, while the data pad 122 may be in a left region of an opposite edge region.

Figure 7:
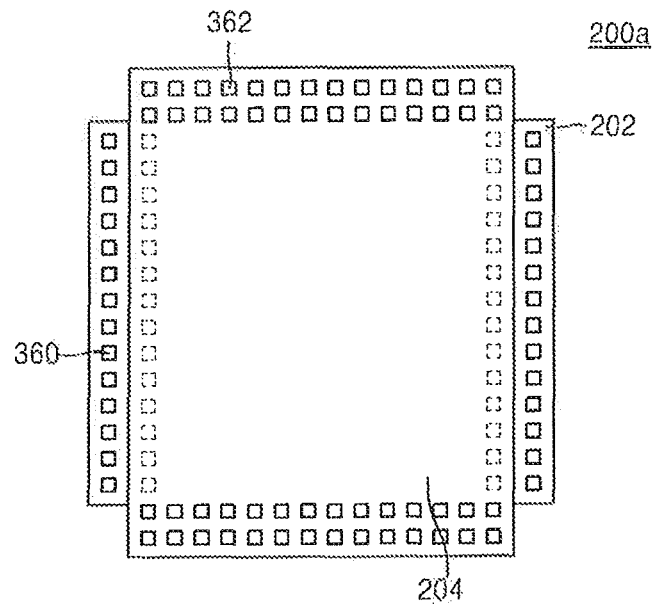
FIG. 7 is a plan view of a semiconductor package according to an exemplary embodiment of the inventive concept, illustrating an arrangement of chips for each channel of a second semiconductor chip unit mounted in a second substrate of a second package of FIG. 1 when the second semiconductor chip unit includes two channels.

FIG. 7 is a plan view of a semiconductor package according to an exemplary embodiment of the inventive concept, illustrating an arrangement of chip pads for each channel of a second semiconductor chip unit 200a mounted in the second package 20 of the semiconductor package 1000 of FIG. 1.

Referring to FIG. 7, the second semiconductor chip unit 200a may include a $(2\text{-}1)^{th}$ semiconductor chip 202 and a $(2\text{-}2)^{th}$ semiconductor chip 204, which may be DDR chips. First chip pads 360 for a first channel may be arranged in opposite left and right edge regions of the $(2\text{-}1)^{th}$ semiconductor chip 202. Second chip pads 362 for a second channel may be arranged in opposite top and bottom edge regions of the $(2\text{-}2)^{th}$ semiconductor chip 204.

The first channel and the second channel may each be a 32-bit channel. The $(2\text{-}1)^{th}$ semiconductor chip 202 and the $(2\text{-}2)^{th}$ semiconductor chip 204 may input and output 32-bit data via the first channel and the second channel, respectively. The first chip pads 360 and the second chip pads 362 may each include a power voltage terminal Vcc for applying a power voltage and a ground terminal Vss for applying a ground voltage.

The $(2\text{-}1)^{th}$ semiconductor chip 202 and the $(2\text{-}2)^{th}$ semiconductor chip 204 may be stacked upon one another in a crosswise direction, e.g., at an angle of 90°. Although, in FIG. 7, the first chip pads 360 of the $(2\text{-}1)^{th}$ semiconductor chip 202 are disposed in two rows in each of the left and right edge regions of the $(2\text{-}1)^{th}$ semiconductor chip 202, and the second chip pads 362 of the $(2\text{-}2)^{th}$ semiconductor chip 204 are arranged in two rows in each of the top and bottom edge region of the $(2\text{-}2)^{th}$ semiconductor chip 202, exemplary embodiments of the inventive concept are not limited thereto. For example, the first chip pads 360 of the $(2\text{-}1)^{th}$ semiconductor chip 202 may be arranged on the top and bottom edge regions of the $(2\text{-}1)^{th}$ semiconductor chip 202, while the second chip pads 362 of the $(2\text{-}2)^{th}$ semiconductor chip 204 may be arranged on the left and right edge regions of the $(2\text{-}2)^{th}$ semiconductor chip 204. In an exemplary embodiment of the inventive concept, the first chip pads 360 and the second chip pads 362 may each be arranged in one row or at least three rows. The order of arranging the data pads and the control/address pads and the patterns thereof may be randomly varied depending on the structures of integrated circuits in the $(2\text{-}1)^{th}$ semiconductor chip 202 and the $(2\text{-}2)^{th}$ semiconductor chip 204, for example.

Figure 8:
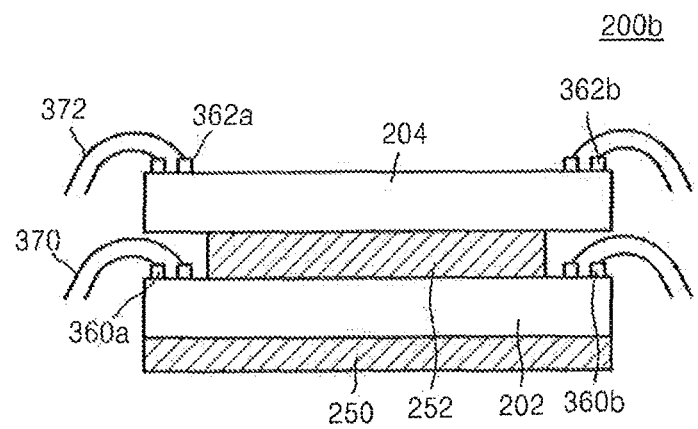
FIG. 8 is a partial cross-sectional view of a semiconductor package according to an exemplary embodiment of the inventive concept, illustrating an arrangement of chip pads for each channel of a second semiconductor chip unit mounted in a second package of the semiconductor package of FIG. 1.

FIG. 8 is a partial cross-sectional view of a semiconductor package according to an exemplary embodiment of the inventive concept, illustrating an arrangement of chip pads for each channel of a second semiconductor chip unit 200b mounted in the second package 20 of the semiconductor package 1000 of FIG. 1.

Referring to FIG. 8, the second semiconductor chip unit 200b may include a $(2\text{-}1)^{th}$ semiconductor chip 202 and a $(2\text{-}2)^{th}$ semiconductor chip 204, which are mounted in the second package 20 of the semiconductor package 1000 of FIG. 1, first and second adhesives 250 and 252, respectively, between the $(2\text{-}1)^{th}$ semiconductor chip 202 and the $(2\text{-}2)^{th}$ semiconductor chip 204, and between the $(2\text{-}1)^{th}$ semiconductor chip 202 and a second substrate (not shown in FIG. 8, but see 210 in FIG. 1), chip pads 360 and 362, and wires 370 and 372. Unlike the embodiment of FIG. 7 where the $(2\text{-}1)^{th}$ semiconductor chip 202 and the $(2\text{-}2)^{th}$ semiconductor chip 204 are stacked upon one another in opposite lengthwise directions in a crosswise pattern, the $(2\text{-}1)^{th}$ semiconductor chip 202 and the $(2\text{-}2)^{th}$ semiconductor chip 204 in the embodiment of FIG. 8 may be stacked upon one another in the same lengthwise direction, not in the opposite lengthwise directions, to align with each other. In other words, according to exemplary embodiments of the inventive concept, the $(2\text{-}1)^{th}$ semiconductor chip 202 and the $(2\text{-}2)^{th}$ semiconductor chip 204 may be stacked to align with each other or may be stacked in opposite lengthwise directions in a crosswise pattern.

Referring to FIG. 8, a first channel data pad 360a of the $(2\text{-}1)^{th}$ semiconductor chip 202 may be arranged in a left upper surface region of the $(2\text{-}1)^{th}$ semiconductor chip 202, while a first channel control/address pad 360b may be arranged in a right upper surface region of the $(2\text{-}1)^{th}$ semiconductor chip 202. A second channel data pad 362a of the $(2\text{-}2)^{th}$ semiconductor chip 204 may be arranged in a left upper surface region of the $(2\text{-}2)^{th}$ semiconductor chip 204, while a second channel control/address pad 362b may be arranged in a right upper surface region of the $(2\text{-}2)^{th}$ semiconductor chip 204. However, the pad arrangements in the $(2\text{-}1)^{th}$ semiconductor chip 202 and the $(2\text{-}2)^{th}$ semicon-ductor chip 204 are not limited thereto. For example, the first channel data pad 360a may be arranged in the right upper surface region of the $(2\text{-}1)^{th}$ semiconductor chip 202, while the first channel control/address pad 360b may be arranged in the left upper surface region of the $(2\text{-}1)^{th}$ semiconductor chip 202. In an exemplary embodiment of the inventive concept, the arrangements of the second channel data pad 362a and the second channel control/address pad 362b in the $(2\text{-}2)^{th}$ semiconductor chip 204 may also be switched with each other. The first channel data pad 360a and the first channel control/address pad 360b of the $(2\text{-}1)^{th}$ semiconductor chip 202 may be arranged in the same direction as or in an opposite direction to the second channel data pad 362a and the second channel control/address pad 362b of the $(2\text{-}2)^{th}$ semiconductor chip 204, respectively.

Figure 9:
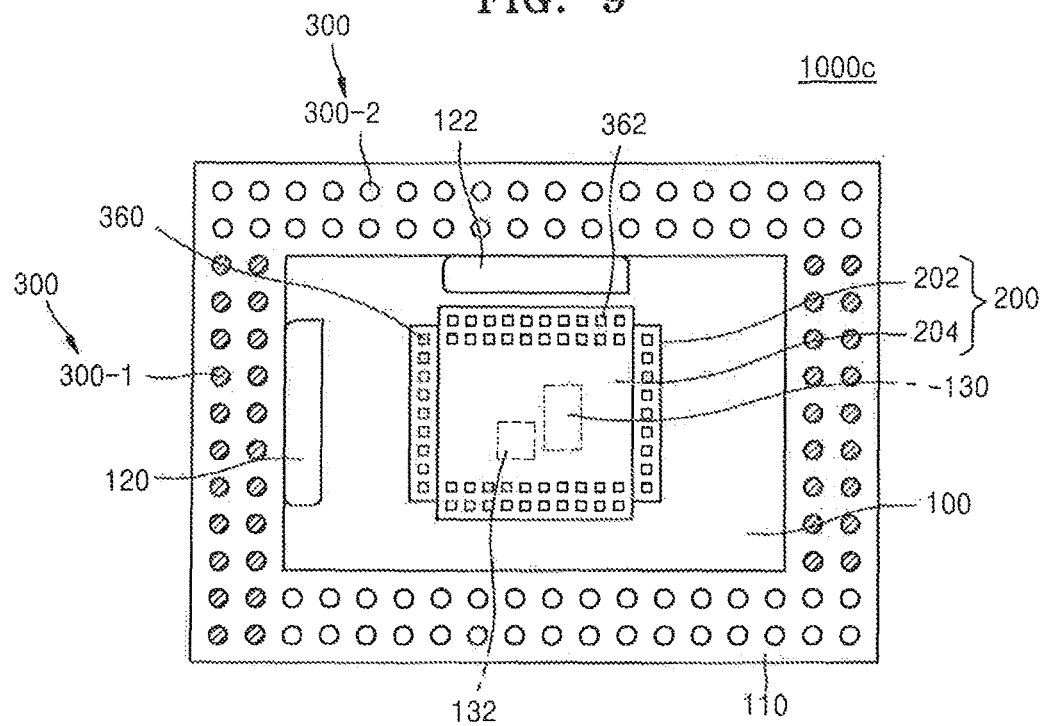
FIGS. 9 to 12 are plan views of semiconductor packages according to exemplary embodiments of the inventive concept, illustrating positions of pads and substrate interconnection members when a semiconductor chip unit mounted in a first substrate of a first package of FIG. 1 has two channels.

FIG. 9 is a plan view of a semiconductor package 1000c according to an exemplary embodiment of the inventive concept, illustrating positions of data pads and control/address pads in the first semiconductor chip unit 100 of the first package 10 of the semiconductor package 1000 of FIG. 1, the $(2-1)^{th}$ semiconductor chip 202 and the $(2-2)^{th}$ semiconductor chip 204, e.g., DDR chips, in the second package 20, and the substrate interconnection members 300 on the upper surface of the first substrate 110.

Referring to FIG. 9, in a semiconductor package having a POP structure according to an exemplary embodiment of the inventive concept, the first channel data pad 120 of the first semiconductor chip unit 100 may be arranged adjacent to the first chip pads 360 of the $(2-1)^{th}$ semiconductor chip 202, and the second channel data pad 122 of the first semiconductor chip unit 100 may be arranged adjacent to the second chip pads 362 of the $(2-2)^{th}$ semiconductor chip 204. The first channel control/address pad 130 and the second channel control/address pad 132 may be arranged in a center region of the first semiconductor chip unit 100 to correspond to the first channel data pad 120 and the second channel data pad 122, respectively. In FIG. 9, the first channel control/address pad 130 and the second channel control/address pad 132 are represented by dashed lines because they are of the first package 10 stacked under the second package 20 and thus are invisible from the top of the second semiconductor chip unit 200.

The substrate interconnection members 300 in the first substrate 110 are represented as blank circles or hatched circles. The hatched circles in the left and right edge regions indicate substrate interconnection members 300-1 for the first channel, and the blank circles in the top and bottom edge regions indicate substrate interconnection members 300-2 for the second channel.

In FIG. 9, the first semiconductor chip unit 100 is illustrated to be larger than the $(2-1)^{th}$ semiconductor chip 202 and the $(2-2)^{th}$ semiconductor chip 204 to describe the positions of the chip pads and the DDR chips. In practice, the first semiconductor chip unit 100 may be the same size or smaller than the $(2-1)^{th}$ semiconductor chip 202 and the $(2-2)^{th}$ semiconductor chip 204. Further, for convenience of explanation, the $(2-1)^{th}$ semiconductor chip 202 and the $(2-2)^{th}$ semiconductor chip 204 are illustrated as being on the first substrate 110, though in practice they are arranged on the second substrate 210 overlapping the first substrate 110 on which the first semiconductor chip unit 100 is mounted.

In an exemplary embodiment of the inventive concept, in the semiconductor package, the chip pads 360 of the $(2-1)^{th}$ semiconductor chip 202 for a 32-bit channel may be arranged on the opposite left and right edge regions, while the chip pads 362 of the $(2-2)^{th}$ semiconductor chip 204 for another 32-bit channel may be arranged in the opposite top and bottom edge regions, thereby making wire interconnection with the first semiconductor chip unit 100 easier. In other words, a DDR chip may include chip pads for a channel in opposite edge regions of the DDR chip. Accordingly, data pads and control/address pads may be arranged in opposite edge regions of an AP chip. However, in a conventional AP chip, data pads and control/address pads are arranged in the same edge region, which mismatches with the arrangement of the chip pads in the DDR chip. This may require connecting an additional wiring to an intermediate or lower printed circuit board (PCB) across opposite edge regions of the semiconductor chip, consequentially deteriorating characteristics of the POP semiconductor package and increasing package thickness. When data pads and control/address pads of an AP chip are arranged separate from one another in opposite edge regions of the AP chip, respectively, the arrangement of the data pads and control/address pads may match with the arrangement of the chip pads in the DDR chip, but may limit timing, latency, or power consumption. According to an exemplary embodiment of the inventive concept, timing, latency, or power consumption may be improved by arranging control/address pads in a center region of a chip. A misalignment of the DDR chips and the pads may also be improved to improve characteristics of the POP semiconductor package.

Figure 10:
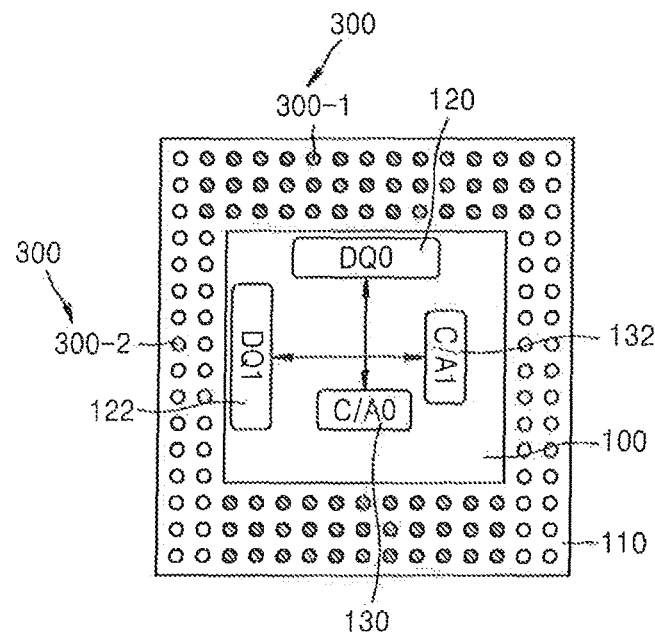

FIG. 10 is a plan view of a semiconductor package according to an exemplary embodiment of the inventive concept, illustrating positions of the first substrate 110, the first semiconductor chip unit 100, pad arrangement regions of the first semiconductor chip 100, and the substrate interconnection members 300-1 and 300-2 in the semiconductor package 1000c of FIG. 9. In FIG. 10, the $(2-1)^{th}$ semiconductor chip 202 and the $(2-2)^{th}$ semiconductor chip 204 of the second semiconductor chip unit 200 are not shown.

Referring to FIG. 10, in a semiconductor package according to an exemplary embodiment of the inventive concept, two data pads 120 and 122 for respective first and second channels may be arranged in adjacent edge regions of the first semiconductor chip unit 100 at an angle of 90°. Control/address pads 130 and 132 may be arranged in a center region of the first semiconductor chip unit 100, opposite to the data pads 120 and 122 for the respective first and second channels, respectively. In FIG. 10, DQ0 and C/A0 indicate a data pad and a control/address pad, respectively, for a first channel, while DQ1 and C/A1 indicate a data pad and a control/address pad, respectively, for a second channel. Accordingly, a pair of DQ0 and C/A0 may form a channel, while a pair of DQ1 and C/A1 may form another channel. In FIG. 10, each bi-directional arrow indicates a pair of two pads. The substrate interconnection members 300 in the first substrate 110 are represented as blank circles or hatched circles. The hatched circles in the top and bottom edge regions of the first substrate 110 indicate substrate interconnection members 300-1 for the first channel, and the blank circles in the left and right edge regions of the first substrate 110 indicate substrate interconnection members 300-2 for the second channel. The substrate interconnection members 300-1 represented as hatched circles may be arranged in three consecutive rows in each of the top and bottom edge regions of the first substrate 110. The substrate interconnection members 300-2 represented as open circles may be arranged in two consecutive rows in each of the left and right edge regions of the first substrate 110. Although the present embodiment discloses that the substrate interconnection members 300-1 represented as hatched circles may be arranged in three consecutive rows in each of the top and bottom edge regions of the first substrate 110, while the substrate interconnection members 300-2 represented as open circles may be arranged in two consecutive rows in each of the left and right edge regions of the first substrate 110, exemplary embodiments of the inventive concept are not limited thereto. For example, the substrate interconnection members 300-1 may be arranged in two rows in the top and bottom edge regions of the first substrate 110, while the substrate interconnection members 300-2 may be arranged in three rows in the left and right edge regions of the first substrate 110.

Figure 11:
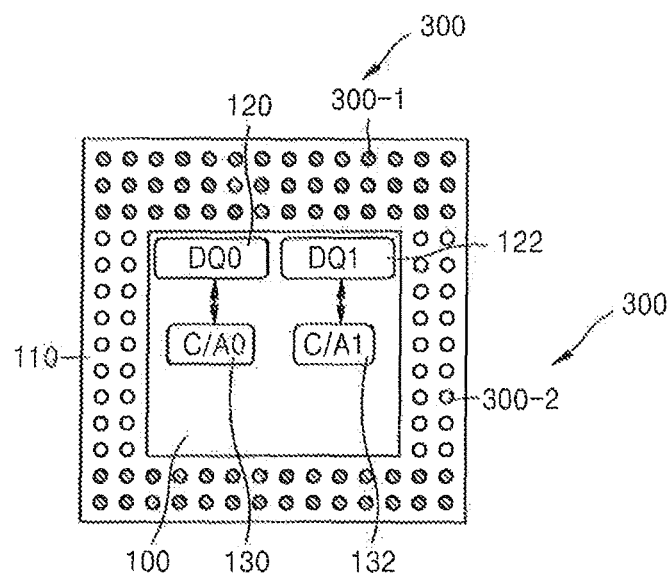

FIG. 11 is a plan view of a semiconductor package according to an exemplary embodiment of the inventive concept, illustrating positions of the first substrate 110, the first semiconductor chip unit 100, pad arrangement regions of the first semiconductor chip unit 100, and the substrate interconnection members 300-1 and 300-2 in the semiconductor package 1000c of FIG. 9. In FIG. 11, the $(2\text{-}1)^{th}$ semiconductor chip 202 and the $(2\text{-}2)^{th}$ semiconductor chip 204 of the second semiconductor chip unit 200 are not shown.

Referring to FIG. 11, in a semiconductor package according to an exemplary embodiment of the inventive concept, two data pads 120 and 122 for respective first and second channels may be arranged side by side in the same edge region of the first semiconductor chip unit 100. Control/address pads 130 and 132 may be arranged opposite to the data pads 120 and 122 for the respective first and second channels, respectively. The control/address pads 130 and 132 may be in a center region of the first semiconductor chip unit 100. A pair of DQ0 and C/A0 may form a channel, while a pair of DQ1 and C/A1 may form another channel. In FIG. 11, each bi-directional arrow indicates a pair of two pads. The substrate interconnection members 300 in the first substrate 110 are represented as blank circles or hatched circles. The hatched circles in the top and bottom edge regions of the first substrate 110 indicate substrate interconnection members 300-1 for the first channel, and the blank circles in the left and right edge regions of the first substrate 110 indicate substrate interconnection members 300-2 for the second channel. The substrate interconnection members 300-1 represented as hatched circles may be arranged in three consecutive rows in one of the top and bottom edge regions of the first substrate 110 along which the two data pads 120 and 122 are arranged side by side and in two consecutive rows in the other top or bottom edge region of the first substrate 110. The substrate interconnection members 300-2 represented as open circles may be arranged in two consecutive rows in each of the left and right edge regions of the first substrate 110. Although the present embodiment discloses that the substrate interconnection members 300-1 represented as hatched circles may be arranged in three consecutive rows in one of the top and bottom edge regions of the first substrate 110 along which the two data pads 120 and 122 are arranged side by side and in two rows in the other top or bottom edge region of the first substrate 110, while the substrate interconnection members 300-2 represented as open circles may be arranged in two consecutive rows in each of the left and right edge regions of the first substrate 110, exemplary embodiments of the inventive concept are not limited thereto. For example, the substrate interconnection members 300-1 may be arranged in three rows in one of the left and right edge regions of the first substrate 110 along which the two data pads 120 and 122 are arranged side by side and in two rows in the other left or right edge region of the first substrate 110, while substrate interconnection members 300-2 may be arranged in two rows in the top and bottom edge regions of the first substrate 110.

Figure 12:
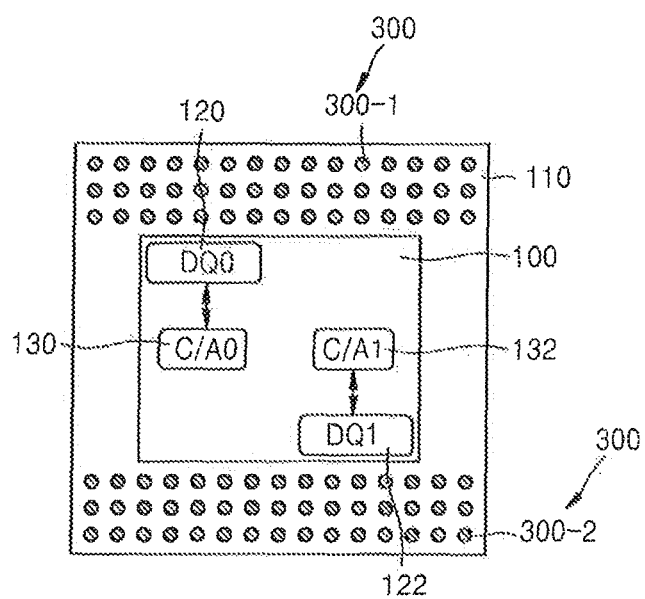

FIG. 12 is a plan view of a semiconductor package according to an exemplary embodiment of the inventive concept, illustrating positions of the first substrate 110, the first semiconductor chip unit 100, pad arrangement regions of the first semiconductor chip 100, and the substrate interconnection members 300-1 and 300-2 in the semiconductor package 1000c of FIG. 9. In FIG. 12, the $(2\text{-}1)^{th}$ semiconductor chip 202 and the $(2\text{-}2)^{th}$ semiconductor chip 204 of the second semiconductor chip unit 200 are not shown.

Referring to FIG. 12, in a semiconductor package according to an exemplary embodiment of the inventive concept, one data pad 120 for a first channel may be arranged in a left side region of one edge region of the first semiconductor chip unit 100, while the other data pad 122 for a second channel may be arranged in a right side region of an opposite edge region of the first semiconductor chip unit 100. One control/address pad 130 may be arranged in a center region of the first semiconductor chip unit 100, opposite to the data pad 120 to form the first channel, while the other control/address pad 132 may be arranged in the center region of the first semiconductor chip unit 100, opposite to the data pad 122 to form the second channel. A pair of DQ0 and C/A0 may form a channel, while a pair of DQ1 and C/A1 may form another channel. In FIG. 12, each bi-directional arrow indicates a pair of two pads. The substrate interconnection members 300 in the first substrate 110 are represented as hatched circles. The hatched circles in the top edge region of the first substrate 110 indicate substrate interconnection members 300-1 for the first channel, and the hatched circles in the bottom edge region of the first substrate 110 indicate substrate interconnection members 300-2 for the second channel. The substrate interconnection members 300-1 and 300-2 represented as hatched circles may be arranged in three consecutive rows in the top and bottom edge regions of the first substrate 110, respectively. Although the present embodiment of FIG. 12 discloses that no substrate interconnection member 300 is arranged on either the left or right edge region of the first substrate 110, exemplary embodiments of the inventive concept are not limited thereto. For example, the inter-substrate interconnection members 300-1 and 300-2 may be arranged in the left and right edge regions of the first substrate 110.

Figure 13:
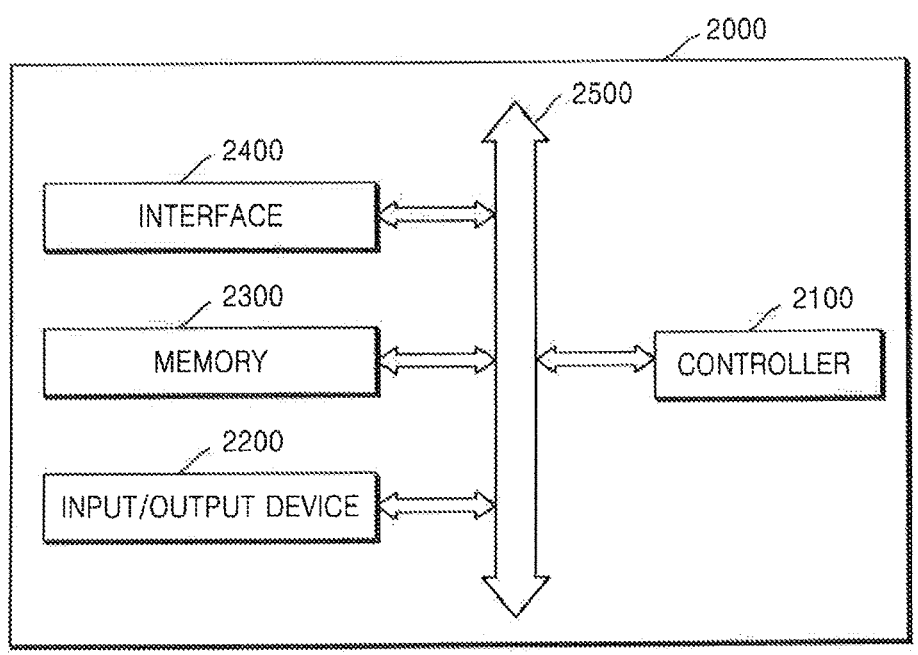
FIG. 13 is a schematic block diagram of an electronic system according to an exemplary embodiment of the inventive concept, including a semiconductor package according to an exemplary embodiment of the inventive concept.

FIG. 13 is a schematic block diagram of an electronic system 2000 according to an exemplary embodiment of the inventive concept, the electronic system 2000 including a semiconductor package according to an exemplary embodiment of the inventive concept.

Referring to FIG. 13, the electronic system 2000 may include a controller 2100, an input/output device 2200, a memory 2300, and an interface 2400. The electronic system 2000 may be a mobile system or a system able to transmit or receive information. For example, the mobile system may be a personal digital assistant (PDA), a portable computer, a web tablet, a wireless phone, a mobile phone, a digital music player, or a memory card.

The controller 2100 may execute a program to control the electronic system 2000. For example, the controller 2100 may be a microprocessor, a digital signal processor, a microcontroller, or any device similar thereto. The input/output device 2200 may input or output data of the electronic system 2000.

The electronic system 2000 may be connected to an external device, for example, a personal computer or a network, to exchange data with the external device via the input/output device 2200. For example, the input/output device 2200 may be a keypad, a keyboard, or a display. The memory 2300 may store a code or data for operating the controller 2100, or data processed by the controller 2100. The controller 2100 and the memory 2300 may include a semiconductor package according to an exemplary embodiment of the inventive concept. The interface 2400 may be a path for data transmission between the electronic system 2000 and an external device. The controller 2100, the input/output device 2200, the memory 2300, and the interface 2400 may communicate with one another via a bus 2500.

For example, the electronic system 2000 may be used in a mobile phone, an MP3 player, a navigation device, a PMP, a solid state disk (SSD), or a household appliance.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor package having a Package On Package (POP) structure, comprising:
a first package comprising a first semiconductor chip mounted on a first substrate;
a second package arranged on the first package and comprising a second semiconductor chip mounted on a second substrate; and
an interconnection member electrically connecting the first substrate and the second substrate,
wherein at least one first pad for a data input/output channel and the same number of second pads for control/address channels as that of the at least one first pad are arranged in the first semiconductor chip,
the at least one first pad is arranged in an edge region of the first semiconductor chip, and
the second pad is arranged in a center region of the first semiconductor chip.

2. The semiconductor package of claim 1, wherein the second pad is arranged in the center region of the first semiconductor chip that is separated by a distance in a substantially vertical direction from an edge of the first semiconductor chip that is closest to the edge region in which the first pad is arranged.

3. The semiconductor package of claim 1, wherein the first semiconductor chip comprises at least one logic chip, and the second semiconductor chip comprises at least one memory chip.

4. The semiconductor package of claim 1, wherein the number of the at least one first pad and the number of second pads are each two,
the first pads are arranged in adjacent edge regions of the first semiconductor chip, respectively, to form an angle of about 90°, and
the second pads are arranged opposite to the first pads, respectively.

5. The semiconductor package of claim 4, wherein the first pads form pairs with the second pads arranged opposite thereto, respectively, to form channels.

6. The semiconductor package of claim 1, wherein the number of the at least one first pad and the number of second pads are each two,
the first pads are arranged side by side in the same edge region of the first semiconductor chip, and
the second pads are arranged opposite to the first pads, respectively.

7. The semiconductor package of claim 6, wherein the first pads form pairs with the second pads arranged opposite thereto, respectively, to form channels.

8. The semiconductor package of claim 1, wherein the number of the at least one first pad and the number of second pads are each two,
the first pads are arranged in opposite edge regions of the first semiconductor chip, respectively, and
the second pads are arranged opposite to the first pads, respectively.

9. The semiconductor package of claim 8, wherein the first pads form pairs with the second pads arranged opposite thereto, respectively, to form channels.

10. The semiconductor package of claim 1, wherein the at least one first pad and the second pads are arranged in an upper surface of the first semiconductor chip, and the upper surface of the first semiconductor chip is opposite to an upper surface of the first substrate.

11. A semiconductor package having a Package On Package (POP) structure, comprising:
a first package comprising a first semiconductor chip mounted in an upper surface of a first substrate;
a second package arranged on the first package and comprising a second semiconductor chip mounted in an upper surface of a second substrate; and
an interconnection member electrically connecting the first substrate and the second substrate,
wherein at least one first pad for a data input/output channel is arranged in an edge region of the first semiconductor chip, and the same number of second pads for control/address channels as that of the at least one first pad are arranged in a central region of the first semiconductor chip, and
a third pad for a data input/output channel and a fourth pad for a control/address channel are arranged in opposite edge regions of the second semiconductor chip, respectively.

12. The semiconductor package of claim 11, wherein the edge region of the first semiconductor chip in which the first pad is arranged and the edge region of the second semiconductor chip in which the third pad is arranged are in substantially vertical direction with respect to one another.

13. The semiconductor package of claim 11, wherein an edge region of the first semiconductor chip opposite to the edge region thereof in which the first pad is arranged and the edge region of the semiconductor chip in which the fourth pad is arranged are in substantially vertical direction with respect to one another.

14. The semiconductor package of claim 11, wherein the at least one first pad and the second pads are arranged in an upper surface of the first semiconductor chip, and
the upper surface of the first semiconductor chip is opposite to the upper surface of the first substrate.

15. The semiconductor package of claim 11, wherein the first semiconductor chip is mounted on the first substrate by flip-chip bonding, and the second semiconductor chip is mounted on the second substrate by wire bonding.

16. A semiconductor package having a Package On Package (POP) structure, comprising:
a first package comprising a first substrate and a first semiconductor chip mounted on the first substrate;
a second package disposed on the first package and comprising a second substrate and a second semiconductor chip mounted on the second substrate;
a first sealant for sealing the first semiconductor chip to the first substrate;
a second sealant for sealing the second semiconductor chip to the second substrate; and
at least one substrate interconnection member for connecting the first substrate and the second substrate,
wherein a first data pad is arranged in an edge region of the first semiconductor chip, and a first control/address pad is arranged in a center region of the first semiconductor chip.

17. The semiconductor package of claim 16, wherein the first semiconductor chip comprises a logic chip, and the second semiconductor chip comprises a memory chip.

18. The semiconductor package of claim 16, further comprising a second data pad and a second control/address pad,
wherein the first and second data pads are arranged in adjacent edge regions of the first semiconductor chip, and the first and second control/address pads are arranged in the center region of the semiconductor chip, opposite to the first and second data pads, respectively.

19. The semiconductor package of claim 18, wherein the substrate interconnection members are arranged in three rows in respective first and second opposite edge regions of the first substrate, and the substrate interconnection members are arranged in two rows in the respective third and fourth opposite edge regions of the first substrate, wherein the first and second data pads are arranged along the first opposite edge region.

20. The semiconductor package of claim 16, further comprising a second data pad and a second control/address pad, and
wherein the first and second data pads are arranged side by side in the same edge region of the first semiconductor chip.

21. The semiconductor package of claim 20, wherein the substrate interconnection members are arranged in three rows in an edge region of the first substrate in which the first and second data pads are arranged, and the substrate interconnection members are arranged in two rows in three other respective edge regions of the first substrate.

22. The semiconductor package of claim 16, further comprising a second data pad and a second control/address pad, and
wherein the first and second data pads are arranged in opposite edge regions of the first semiconductor chip.

23. The semiconductor package of claim 22, wherein the substrate interconnection members are arranged in three rows in respective edge regions of the first substrate in which the first and second data pads are arranged, and the substrate interconnection members are not arranged in the other edge regions of the first substrate.

24. The semiconductor package of claim 16, wherein the first data pad and the first control/address pad form a channel.

* * * * *